United States Patent
Ramdani et al.

(10) Patent No.: US 6,319,730 B1
(45) Date of Patent: *Nov. 20, 2001

(54) METHOD OF FABRICATING A SEMICONDUCTOR STRUCTURE INCLUDING A METAL OXIDE INTERFACE

(75) Inventors: Jamal Ramdani, Gilbert; Ravindranath Droopad, Chandler; Zhiyi Yu, Gilbert, all of AZ (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/354,522

(22) Filed: Jul. 15, 1999

(51) Int. Cl.$^7$ ............................................. H01L 21/00
(52) U.S. Cl. ............................................. 438/3; 438/240
(58) Field of Search ................... 438/3, 238–240, 438/250–256, 381, 393–399

(56) References Cited

U.S. PATENT DOCUMENTS 5,879,956  *  3/1999   Seon et al. ............................. 438/3

FOREIGN PATENT DOCUMENTS

2000068466  *  3/2000  (JP) .

* cited by examiner

*Primary Examiner*—Charles Bowers
*Assistant Examiner*—Thanh Nguyen
(74) *Attorney, Agent, or Firm*—Oblon, Spivak, McClelland, Maier & Neustadt, P.C.

(57) ABSTRACT

A method for fabricating a semiconductor structure including the steps of providing a silicon substrate (10) having a surface (12); forming amorphous silicon dioxide (14) on the surface (12) of the silicon substrate (10); providing a metal oxide (18) on the amorphous silicon dioxide (14); heating the semiconductor structure to form an interface comprising a seed layer (20) adjacent the surface (12) of the silicon substrate (10); and forming one or more layers of a high dielectric constant oxide (22) on the seed layer (20).

23 Claims, 1 Drawing Sheet

US 6,319,730 B1

METHOD OF FABRICATING A SEMICONDUCTOR STRUCTURE INCLUDING A METAL OXIDE INTERFACE

FIELD OF THE INVENTION

The present invention relates in general to a method for fabricating a semiconductor structure including a crystalline metal oxide interface between a silicon substrate and metal oxides, and more particularly to a method for fabricating an interface including a seed layer and a high dielectric constant oxide.

BACKGROUND OF THE INVENTION

An ordered and stable silicon (Si) surface is most desirable for subsequent epitaxial growth of single crystal thin films on silicon for numerous device applications, e.g., ferroelectrics or high dielectric constant oxides for non-volatile high density memory and next generation MOS devices. It is pivotal to establish an ordered transition layer on the Si surface, especially for subsequent growth of single crystal oxides, e.g., perovskites.

Some reported growth of these oxides, such as BaO and $BaTiO_3$ on Si (100) were based on a $BaSi_2$ (cubic) template by depositing one fourth monolayer of Ba on Si (100) using molecular beam epitaxy at temperatures greater than 850° C. See for example: R. McKee et al., *Appl. Phys. Lett.* 59(7), pp. 782–784 (Aug. 12, 1991); R. McKee et al., *Appl. Phys. Lett.* 63(20), pp. 2818–2820 (Nov. 15, 1993); R. McKee et al., *Mat. Res. Soc. Symp. Proc.*, Vol. 21, pp. 131–135 (1991); U.S. Pat. No. 5,225,031, issued Jul. 6, 1993, entitled "PROCESS FOR DEPOSITING AN OXIDE EPITAXIALLY ONTO A SILICON SUBSTRATE AND STRUCTURES PREPARED WITH THE PROCESS"; and U.S. Pat. No. 5,482,003, issued Jan. 9, 1996, entitled "PROCESS FOR DEPOSITING EPITAXIAL ALKALINE EARTH OXIDE ONTO A SUBSTRATE AND STRUCTURES PREPARED WITH THE PROCESS". A strontium silicide ($SrSi_2$) interface model with a c(4×2) structure was proposed. See for example: R. McKee et al., *Phys. Rev. Lett.* 81(14), 3014 (Oct. 5, 1998). However, atomic level simulation of this proposed structure indicates that it likely is not stable at elevated temperatures.

Growth of $SrTiO_3$ on silicon (100) using an SrO buffer layer has been accomplished. See for example: T. Tambo et al., *Jpn. J. Appl. Phys.*, Vol. 37 (1998), pp. 4454–4459. However, the SrO buffer layer was thick (100 Å), thereby limiting application for transistor films, and crystallinity was not maintained throughout the growth.

Furthermore, $SrTiO_3$ has been grown on silicon using thick oxide layers (60–120 Å) of SrO or $TiO_x$. See for example: B. K. Moon et al., *Jpn. J. Appl. Phys.*, Vol. 33 (1994), pp. 1472–1477. These thick buffer layers would limit the application for transistors.

Therefore, a method for fabricating a thin, stable crystalline silicate interface with silicon is needed.

SUMMARY OF THE INVENTION

The above problems and others are at least partially solved and the above purposes and others are realized in a method of fabricating a semiconductor structure including the steps of providing a silicon substrate having a surface, forming on the surface of the silicon substrate a seed layer comprising a silicate crystalline material and forming one or more layers of a high dielectric constant oxide on the seed layer.

BRIEF DESCRIPTION OF THE DRAWINGS

Referring to the Drawings

DETAILED DESCRIPTION OF THE PREFERRED EMBODIMENT

This disclosure teaches a method of fabricating a high dielectric constant (high-k) metal oxide having an interface with a silicon substrate. The process is based on the solid state reaction of a metal oxide, such as strontium oxide (SrO), barium oxide (BaO), calcium oxide (CaO), zirconium oxide ($ZrO_2$), hafnium oxide ($HfO_2$), or the like, with $SiO_2$, to form a stable silicate seed layer necessary for the subsequent growth of alkaline-earth metal oxide layers. Accordingly, disclosed is a new method of growing perovskite oxides such as $SrTiO_3$, $BaTiO_3$, $SrBaTiO_3$, $CaTiO_3$, or the like.

To form the novel interface between a silicon (Si) substrate and one or more layers of a high dielectric constant (high-k) metal oxide, various approaches may be used. Several examples will be provided for starting with a Si substrate having silicon dioxide ($SiO_2$) on the surface. The silicon dioxide is disclosed as formed as a native oxide, or by utilizing thermal, or chemical techniques. $SiO_2$ is amorphous rather than single crystalline and it is desirable for purposes of growing additional single crystal material on the substrate that a single crystal oxide layer be provided as the interface.

Figure 1:
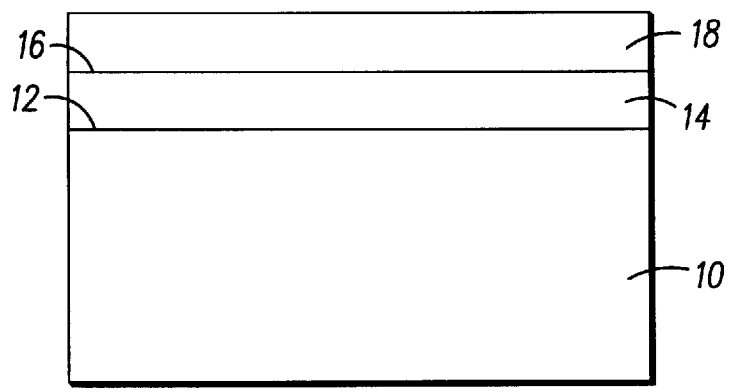
FIG. 1 illustrates a cross-sectional view of a clean semiconductor substrate having a plurality of oxide layers formed thereon and in accordance with the present invention.

Turning now to the drawings in which like elements are designated with like numbers throughout the FIGs., FIG. 1 illustrates a Si substrate 10 having a surface 12, and a layer 14 of $SiO_2$ thereupon. In this particular embodiment, layer 14 of $SiO_2$ naturally exists (native oxide) once the silicon substrate 10 is exposed to air (oxygen). Alternatively, layer 14 of $SiO_2$ may be formed purposely in a controlled fashion well known in the art, e.g., thermally by applying oxygen onto the surface 12 at a high temperature, or chemically using a standard chemical etch process. Layer 14 is formed with a thickness in a range of 5–100 Å thick, and more particularly with a thickness in a range of 10–25 Å.

The novel seed layer (discussed presently) is formed by depositing an amorphous metal oxide such as SrO, BaO or the like 18 to the surface 16 of $SiO_2$ layer 14 at 0–900° C. More specifically, the Si substrate 10 and the amorphous $SiO_2$ layer 14 are heated to a temperature below the sublimation temperature of the $SiO_2$ layer 14 (generally below 900° C.). This can be accomplished in a molecular beam epitaxy chamber or in a chemical or physical vapor deposition chamber under inert ambient conditions.

Figure 2:
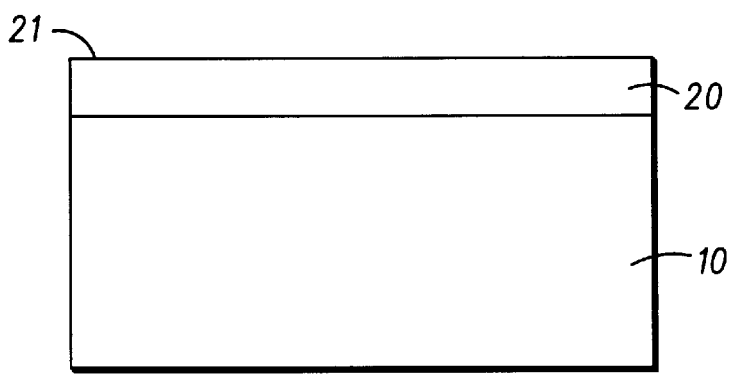
FIG. 2 illustrates a cross-sectional view of a semiconductor substrate having an interface seed layer formed of a crystalline silicate layer in accordance with the present invention.

Once the substrate 10 is properly heated and the surface 12 of the substrate 10 having $SiO_2$ layer 14 thereon is exposed to a beam of metal 18, such as strontium (Sr) barium (Ba), calcium (Ca), zirconium (Zr), hafnium (Hf), or the like in an oxygen atmosphere under $O_2$ pressure equal to or less than $1 \times 10^{-4}$ mBar to form an amorphous oxide onto the $SiO_2$ oxide 14 as illustrated in FIG. 1. In a preferred embodiment, the beam is Ba or Sr which is generated by resistively heating effusion cells or from e-beam evaporation sources. In a specific example, substrate 10 and $SiO_2$ layer 14 are exposed to a beam of Sr and Oxygen $O_2$. The SrO joins the $SiO_2$ and converts the $SiO_2$ layer 14 into a seed layer 20 comprised of $SrSiO_4$ or $SrSiO_3$, or the like, in a crystalline form as illustrated in FIG. 2.

This step provides for the formation of a stable silicate on the silicon substrate, more particularly the formation of seed layer 20. The thickness of metal oxide layer 20 is approximately the same thickness of the $SiO_2$ oxide layer 14, more specifically in the range of 5–100 Å, with a preferred thickness in the range of 10–25 Å. This silicate layer is crystalline and ordered showing a 2×1 reconstruction.

In this particular embodiment, the application of the Sr and oxygen to the surface 16 of layer 14 and subsequent heating causes a chemical reaction, forming $SrSiO_3$ or $SrSiO_4$, or the like as the seed layer 20. During fabrication, this growth is monitored using reflection high energy electron diffraction (RHEED) techniques which are well documented in the art and which can be used in situ, i.e., while performing the exposing step within the growth chamber. The RHEED techniques are used to detect or sense surface crystalline structures and in the present process change rapidly to strong and sharp streaks by the forming of a few atomic layers of the $SrSiO_4$, $SrSiO_3$, or the like. It will of course be understood that once a specific manufacturing process is provided and followed, it may not be necessary to perform the RHEED techniques on every substrate. Alternatively, monitoring of the crystalline structure can be accomplished utilizing any surface sensitive technique, such as reflection difference spectroscopy, spectroscopic ellipsometry, or the like wherein the surface is monitored by in situ techniques.

It should be understood by those skilled in the art that the temperatures and pressures given for these processes are recommended for the particular embodiment described, but the invention is not limited to a particular temperature or pressure range. As taught, seed layer 20 comprises rows of strontium, silicon, and oxygen atoms in a 2×1 configuration on a (001) surface of silicon substrate 10, 1× in the <110> direction and 2× in the orthogonal <110> direction.

Figure 3:
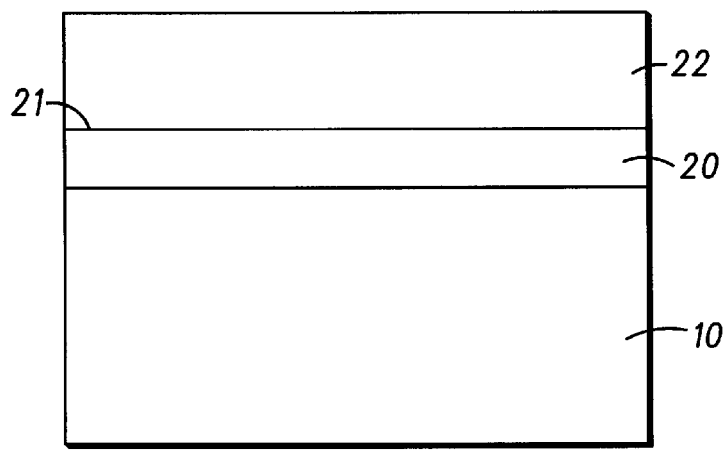
FIG. 3 illustrates a cross-sectional view of a high dielectric constant metal oxide layer formed on the structure illustrated in FIG. 2 in accordance with the present invention.

Referring to FIG. 3, the formation of high dielectric constant oxide layer 22 may be accomplished by either the simultaneous or alternating supply to a surface 21 of the seed layer 20 of a crystalline silicate at less than or equal to 800° C., more particularly at a temperature in a range of 350–650° C. and under $O_2$ partial pressure less than or equal to $1\times10^{-4}$ mBar.

Single crystal high dielectric constant oxide layer 22, more particularly a perovskite, is formed on surface 21 of the seed layer 20 by either the simultaneous or alternating supply of alkaline metal (Sr, Ba etc), oxygen, and a transition metal, such as titanium, at less than or equal to 800° C. under an oxygen partial pressure less than or equal to $1\times10^{-4}$ mBar. This single crystal oxide layer 22 may, for example, comprise a thickness of 50–1000 Å and will be substantially lattice matched with the underlying seed layer 20.

Accordingly, disclosed is a method for fabricating a thin, crystalline seed layer 20 with silicon 10 as been described herein. The interface, or seed layer, 20 may comprise a single atomic layer. This forcing of the formation of a silicate layer is necessary for the subsequent growth of a perovskite film thereon. Better transistor applications are achieved by the interface being thin, in that the electrical coupling effects of the overlying high dielectric constant oxide layers are not compromised, and in that the seed layer 20 is more stable since the atoms will more likely maintain their crystallinity in processing.

What is claimed is:

1. A method of fabricating a semiconductor structure comprising the steps of:
   providing a silicon substrate having a surface;
   forming on the surface of the silicon substrate a seed layer comprising a single crystal silicate material, comprising the steps of:
      forming on the silicon substrate a silicon oxide layer having a surface;
      depositing a metal oxide on the surface of the silicon oxide layer; and
      heating the silicon oxide layer and the metal oxide thereby converting substantially all of the silicon oxide layer and metal oxide into the single crystal silicate material; and
   forming one or more layers of a single crystal high dielectric constant oxide on the seed layer.

2. The method of fabricating a semiconductor structure of claim 1 wherein the forming the seed layer step includes forming a 2×1 reconstruction.

3. The method of fabricating a semiconductor structure of claim 1 wherein the step of forming a seed layer includes forming the seed layer in UHV environment.

4. The method of fabricating a semiconductor structure of claim 1 wherein the step of forming a seed layer includes forming the seed layer in a chemical vapor deposition system.

5. The method of fabricating a semiconductor structure of claim 1 wherein the step of forming a seed layer includes forming in a physical vapor deposition system.

6. The method of fabricating a semiconductor structure of claim 1 wherein the step of forming a seed layer comprises forming at least a single monolayer of silicon, oxygen, and a metal.

7. The method of fabricating a semiconductor structure of claim 6 wherein the metal is selected from the group of strontium, barium, calcium, zirconium, and hafnium.

8. A method of fabricating a semiconductor structure comprising the steps of:
   providing a silicon substrate having a surface;
   forming amorphous silicon dioxide on the surface of the silicon substrate;
   providing a metal oxide on the amorphous silicon dioxide; and
   heating the semiconductor structure to convert substantially all of the amorphous silicon dioxide and metal oxide to form an interface comprising a crystalline seed layer adjacent the surface of the silicon substrate.

9. The method of fabricating a semiconductor structure of claim 8 wherein the heating step includes forming the interface with a 2×1 reconstruction.

10. The method of fabricating a semiconductor structure of claim 8 wherein the steps of providing a metal oxide and heating the semiconductor structure are accomplished in an ultra-high-vacuum system.

11. The method of fabricating a semiconductor structure of claim 8 wherein the steps of providing a metal oxide and heating the semiconductor structure are accomplished in a chemical vapor deposition system.

12. The method of fabricating a semiconductor structure of claim 8 wherein the steps of providing metal oxide and heating the semiconductor structure are accomplished in a physical vapor deposition system.

13. The method of fabricating a semiconductor structure of claim 8 wherein the heating step includes forming an interface including a seed layer of silicon, oxygen, and a metal.

14. The method of fabricating a semiconductor structure of claim 13 wherein the metal oxide is selected from the group of barium, strontium, calcium, zirconium, and hafnium.

15. The method of fabricating a semiconductor structure of claim 8 wherein the heating step to form the seed layer comprises the steps of:

forming a silicon oxide layer having a surface;

depositing a metal oxide on the surface of the silicon oxide layer; and heating the silicon oxide layer and the metal oxide to form a silicate crystalline material seed layer.

16. The method of fabricating a semiconductor structure of claim 8 wherein the step of heating the semiconductor structure comprises forming at least a single monolayer of silicon, oxygen, and a metal.

17. A method of fabricating a semiconductor structure comprising the steps of:

providing a silicon substrate having a surface;

forming amorphous silicon dioxide on the surface of the silicon substrate;

providing a metal oxide on the amorphous silicon dioxide;

heating the semiconductor structure to convert substantially all of the amorphous silicon dioxide and metal oxide to form an interface comprising a crystalline seed layer adjacent the surface of the silicon substrate; and forming one or more layers of a single crystal high dielectric constant oxide on the seed layer.

18. The method of fabricating a semiconductor structure of claim 17 wherein the step of forming the seed layer includes forming an interface having a 2×1 reconstruction.

19. The method of fabricating a semiconductor structure of claim 17 wherein the step of providing a metal oxide is accomplished in an ultra-high-vacuum system.

20. The method of fabricating a semiconductor structure of claim 17 wherein the step of providing a metal oxide is accomplished in a chemical vapor deposition system.

21. The method of fabricating a semiconductor structure of claim 17 wherein the step of providing a metal oxide is accomplished in a physical vapor deposition system.

22. The method of fabricating a semiconductor structure of claim 17 wherein the metal oxide on the amorphous silicon dioxide is selected from the group of barium oxide, strontium oxide, calcium oxide, zirconium oxide, and hafnium oxide.

23. The method of fabricating a semiconductor structure of claim 17 wherein the step of heating the semiconductor structure comprises forming at least a single monolayer of silicon, oxygen, and a metal.

* * * * *